United States Patent [19]

Vranish

[11] Patent Number: 5,515,001
[45] Date of Patent: May 7, 1996

[54] CURRENT-MEASURING OPERATIONAL AMPLIFIER CIRCUITS

[75] Inventor: John M. Vranish, Crofton, Md.

[73] Assignee: The United States of America as represented by the United States National Aeronautics and Space Administration, Washington, D.C.

[21] Appl. No.: 189,344

[22] Filed: Jan. 31, 1994

[51] Int. Cl.⁶ .............................. H03F 3/45; H03F 1/34; G01R 1/30
[52] U.S. Cl. .................. 330/69; 324/123 C; 330/75
[58] Field of Search .................. 324/123 C, 123 R, 324/124; 330/69, 75, 110, 146

[56] References Cited

U.S. PATENT DOCUMENTS

| | | | |
|---|---|---|---|
| 3,617,881 | 11/1971 | McCormick | 330/69 X |
| 4,551,687 | 11/1985 | Lukens | 330/258 |
| 4,716,378 | 12/1987 | Jiko et al. | 330/146 X |
| 5,065,088 | 11/1991 | Habiro et al. | 324/117 H |
| 5,113,143 | 5/1992 | Wei | 330/10 |
| 5,157,288 | 10/1992 | Hill | 307/511 |
| 5,159,277 | 10/1992 | Mount | 324/721 |

*Primary Examiner*—Steven Mottola
*Attorney, Agent, or Firm*—Robert D. Marchant

[57] ABSTRACT

An operational amplifier connected in series with a load and a current-measuring impedance and having at least two input ports and an output port, the output port of the operational amplifier further being directly connected to current-measuring impedance, with one of the input ports being coupled to the current input source to be measured, and the other input port being connected to a feedback loop coupled from the output side of the current-measuring impedance. The voltage across the current-measuring impedance which comprises a resistor is thereafter sensed, amplified and conditioned to provide a voltage which is proportional to the load current and accordingly a measure of the current input from the current source being measured. Such a current-measuring circuit can be used in connection with an inverter, a current-measuring amplifier, a current-measuring precision diode, a current integrator, and a current-measuring bridge.

30 Claims, 4 Drawing Sheets

FIG. 1
(PRIOR ART)
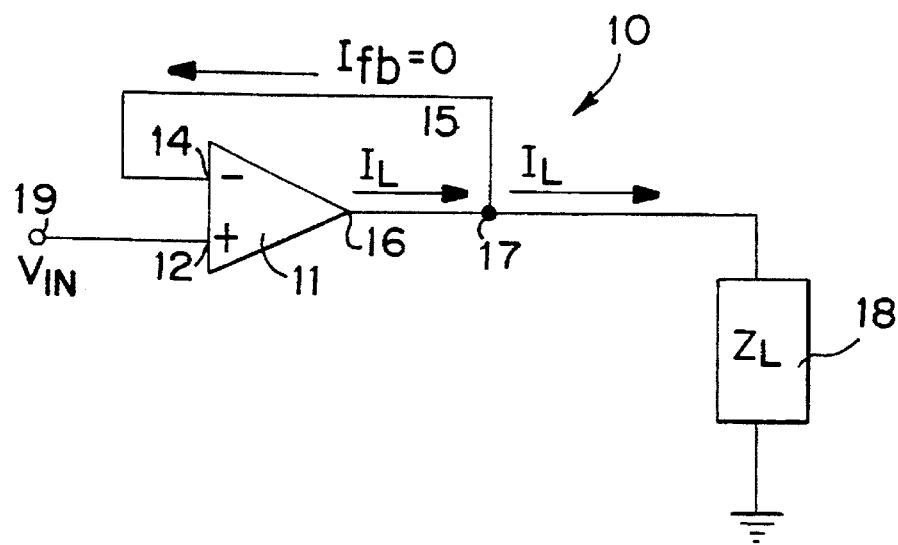
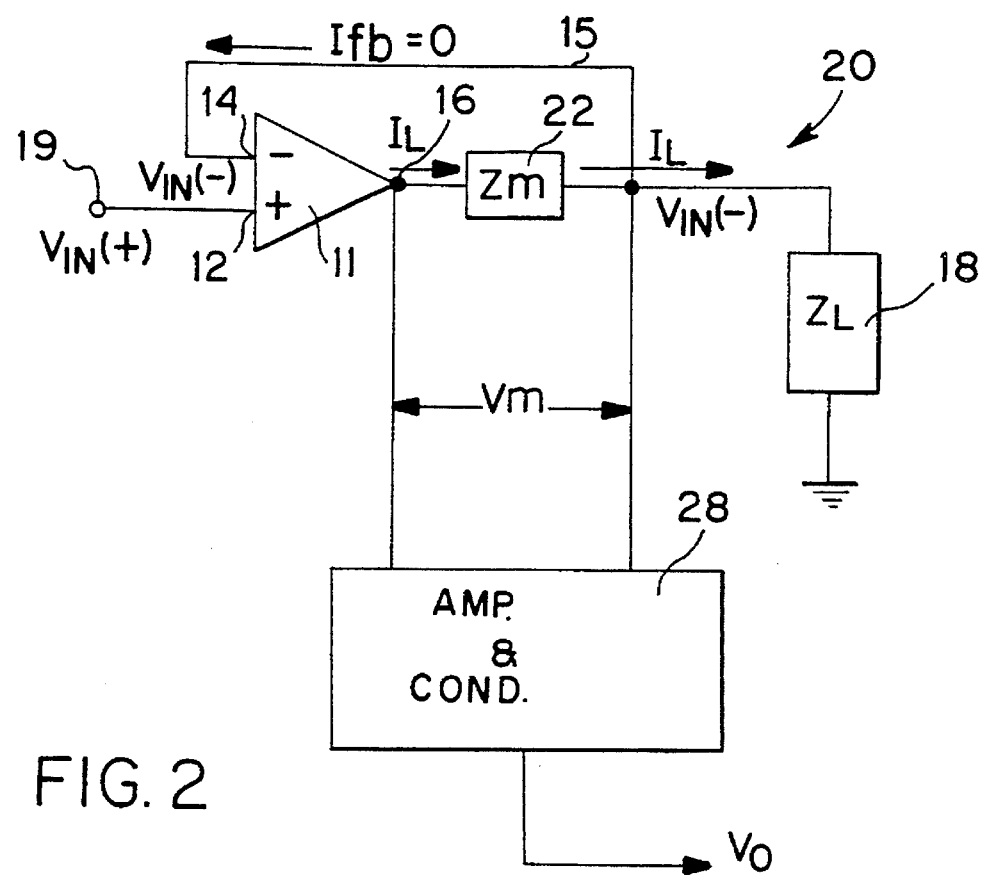
FIG. 2

CURRENT-MEASURING OPERATIONAL AMPLIFIER CIRCUITS

ORIGIN OF THE INVENTION

This invention may be made and used by or for the Government for governmental purposes without the payment of any royalties thereon or therefor.

BACKGROUND OF THE INVENTION

1. Field of the Invention

This invention relates generally to instrumentation electronics and more particularly to electronic circuitry which provides a measure of current flow in a circuit.

2. Description of the Prior Art

Techniques for measuring electrical current are well known and cover a wide spectrum of devices and circuits including classical current meters and circuits which add known current-measuring resistance in series with a load, whereupon the voltage drop across the resistor is measured, thus yielding a measure of that current. However, the act of measuring the current often affects the results in that there is a voltage drop across the resistor as well as across the load so that the voltage across the load in effect "droops". If the load is reactive or partially reactive, the measurement also introduces a phase shift in the current. Thus to keep these effects to a minimum, the resistance must be kept relatively small which ultimately reduces the accuracy of the measurement. While high gain instrumentation amplifiers can somewhat compensate for this effect, they also have a tendency to introduce noise which is undesirable and cannot be tolerated in certain applications, such as capacitance type proximity sensors. Accordingly, there is a need to provide current-measuring circuitry which will permit such proximity sensors to be operated relatively close to one another without being affected by cross-talk between them.

SUMMARY

Accordingly, it is an object of the present invention, therefore, to provide an improvement in current-measuring apparatus.

It is another object of the invention to provide a means for providing current measurement in a straight forward, simple, precise and compact manner.

It is a further object of the invention to provide an improvement in current-measuring circuitry which can be utilized to measure relatively small currents.

It is yet another object of the invention to provide an electronic circuit which will permit sensors to be operated in close proximity to each other without cross talk by means of locking each of the other in voltage phase and frequency.

The foregoing and other objects of the invention are achieved in its simplest form by means of an operational amplifier connected in series with a load and a current-measuring impedance and having at least two input ports and an output port, the output port of the operational amplifier further being directly connected to current-measuring impedance, with one of the input ports being coupled to the current input source, and the other input port being connected to a feedback loop coupled from the output side of the current-measuring impedance. The voltage across the current-measuring impedance which comprises a resistor is thereafter sensed, amplified and conditioned to provide a voltage which is proportional to the load current and accordingly a measure of the current output from the current source being measured. Such a current-measuring circuit can be used in connection with an inverter, a current-measuring amplifier, a current-measuring precision diode, a current integrator, and a current-measuring bridge.

BRIEF DESCRIPTION OF THE DRAWINGS

The following detailed description of the invention will be more readily understood when considered together with the accompanying drawings in which:

FIG. 1 is a schematic diagram of a conventional operational amplifier type voltage follower circuit;

FIG. 2 is an electrical schematic diagram of a current-measuring voltage follower circuit in accordance with the subject invention;

DETAILED DESCRIPTION OF THE INVENTION

Figure 3:
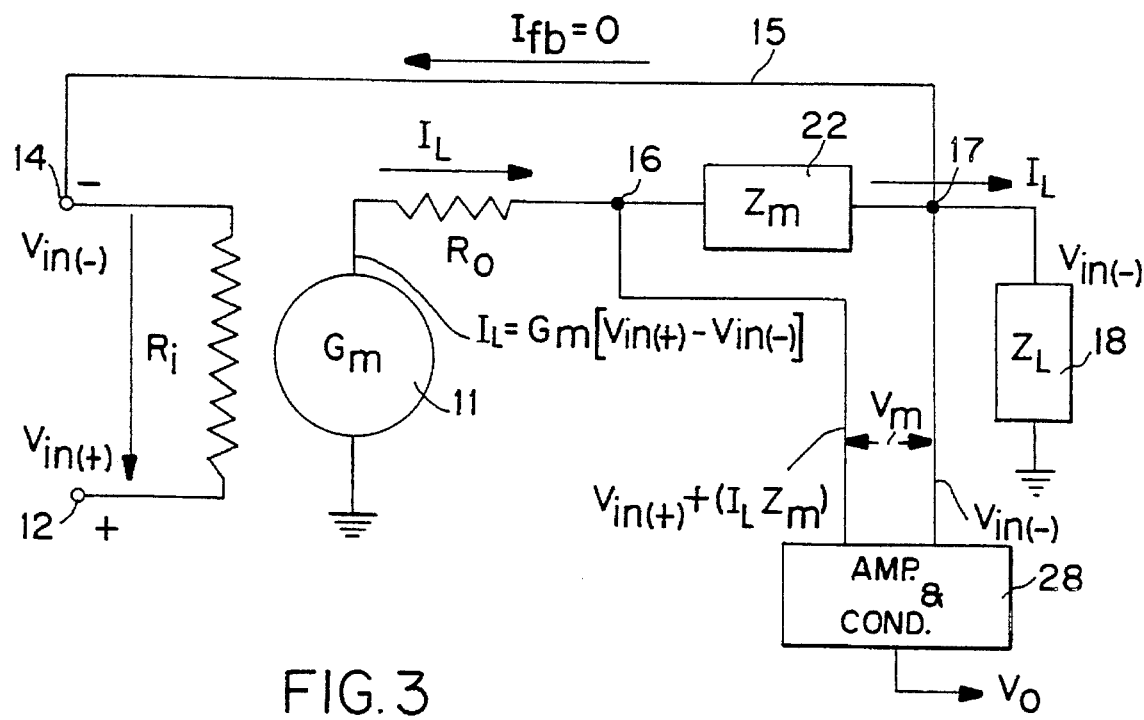
FIG. 3 is an electrical equivalent circuit diagram of the circuit shown in FIG. 2.

Referring now to the drawings wherein like reference numerals refer to like parts throughout, attention is directed first to FIG. 1 wherein there is shown a conventional operational amplifier circuit 10 configured as a voltage follower. Reference numeral 11 denotes an operational amplifier (op-amp) having a non-inverting(+) input port 12, an inverting(−) input port 14, and an output port 16. The output port 16 is coupled from circuit node 17 back to the inverting(−) input port 14 by way of feedback loop 15 and also to a load impedance 18 which is shown returned to ground. A terminal 19 for the application of an input voltage $V_{in}$ is directly connected to the non-inverting (+) port 12.

The circuit configuration 10 is, in effect, a precision high gain servo system where the voltage applied to the (+) input port 12 is servoed through the op-amp 11 to its (−) input port. Both of the input (+) and (−) input ports 12 and 14 comprise high impedance inputs; however, the device so configured becomes a current source having a low impedance output at the output port 16.

If a standard voltage follower circuit 10 as shown in FIG. 1 were to be inserted between a voltage source and capacitive sensor, for example, the required current would be supplied thereby but there would be no measurement of the current. Since there are instances where one needs to know the amount of current being supplied to the sensor, the subject invention in its simplest form involves a current-measuring voltage follower circuit 20 as shown in FIG. 2. The current 20 of FIG. 2 is derived from the voltage follower circuit 10 of FIG. 1 by the inclusion of a current measurement resistive type impedance element 22, typically a fixed resistor of a predetermined value or magnitude, connected in series between the output port 16 and the circuit node 17 which is common to the load impedance 18 and the feedback loop 15.

If the feedback loop 15 is such that the magnitude of the feedback current $I_{fb}$ is negligible or substantially equal to zero, i.e. $I_{fb} \approx 0$, then the output current out of the operational amplifier 11 is equal to the load current $I_L$ at the circuit node 17. By connecting an amplifying and conditioning circuit 28 across the current measurement impedance 22, a voltage $V_m = I_L \times Z_m$ is generated across the impedance 22 which is proportional to current $I_L$ and, further, when applied to the amplifying and conditioning circuit 28, there is provided an output voltage $V_0$ which is also proportional to the current $I_L$.

An equivalent circuit of the current-measuring voltage follower 10 is shown in FIG. 3 and is helpful in understanding the operation of the current-measuring voltage follower shown in FIG. 2. As shown in FIG. 3, the operational amplifier 11 includes an input resistive impedance $R_i$ to which the (+) and (−) input ports 12 and 14 are connected to opposite ends thereof. The operational amplifier 11 is further shown providing a current open loop current gain of $G_m$ and having an output resistive impedance $R_0$ which is shown as a series resistor coupled to the output port 16.

As shown, the output current $I_L$ from the operational amplifier 11 is expressed as:

$$I_L = G_m[V_{in}(+) - V_{in}(-)] \quad (1)$$

The voltage at terminal 16 can be expressed as:

$$V_{in}(-) + (I_L Z_m). \quad (2)$$

Since the voltage at circuit node 17 corresponds to $V_{in}(-)$, then the voltage $V_m$ across the current sensing resistor 22 is:

$$V_m = V_{in}(-) + I_L Z_m - V_{in}(-) = I_L Z_m \quad (3)$$

Again, the amplifying and conditioning circuit 28 is shown coupled across circuit nodes 16 and 17, providing an output voltage $V_0$ which is proportional to the current $I_L$.

Figure 4:
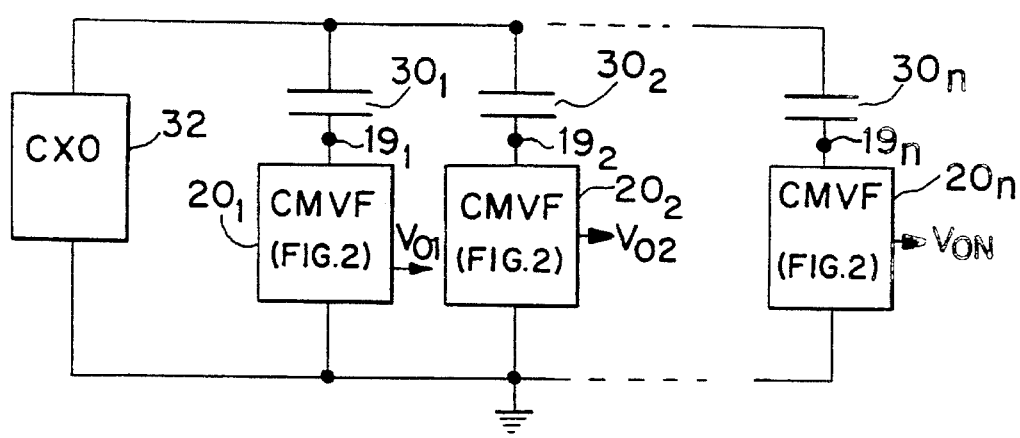
FIG. 4 is an electrical schematic diagram of a typical application for the current-measuring voltage follower shown in FIG. 2.

The current-measuring voltage follower circuit 20 shown in FIG. 2 is particularly applicable where a plurality of proximity sensors, shown in FIG. 4 as a plurality of relatively closely spaced capacitive type proximity sensors $30_1$, $30_2 \ldots 30_n$, are utilized in connection with the end effector and arm of a robotic device, not shown, and where the sensors are all commonly energized from a single source such as a precision crystal controlled oscillator 32 so as to facilitate noise rejection and filtering. Each of the sensors $30_1, 30_2 \ldots 30_n$ couple to a respective input terminal $19_1$, $19_2 \ldots 19_n$ of the current-measuring voltage followers $20_1$, $20_2 \ldots 20_n$ to which provide individual current indicating outputs of $V_{01}, V_{02} \ldots V_{on}$.

The current-measuring voltage follower concept of FIG. 2 can be extended to other types of circuits which are also capable of providing a current-measuring function as will now be described.

Figure 5:
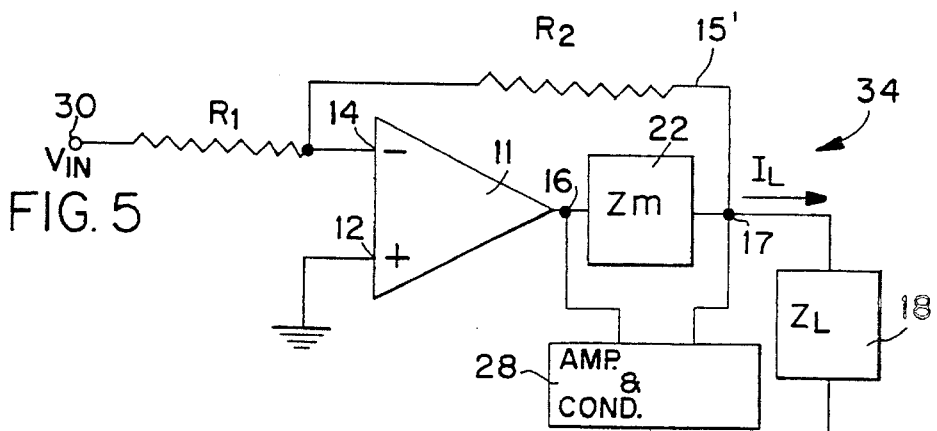
FIG. 5 is an electrical schematic diagram illustrative of a current-measuring inverter circuit in accordance with the subject invention.

Referring now to FIG. 5, shown thereat is a current-measuring inverting amplifier circuit 34 which has the non-inverting or (+) input port 12 of the op-amp 11 returned to ground. The input signal is also now applied to the inverting or (−) input port 14 via input signal terminal 36 and a resistive impedance $R_1$. Also instead of a direct circuit type feedback loop 15 (FIG. 2) coupled between circuit node 17 and the (−) input port 14, it now comprises a feedback loop 15' which includes impedance means comprising a resistive impedance $R_2$. The impedance values of $R_1$ and $R_2$ are chosen such that $R_2 = R_1$, in which case a simple signal inverter results; however, if $R_2 > R_1$, then an inverting amplifier is provided. In both instances, the voltage across the current sensing impedance 22 is equal to $I_L Z_m$. With the amplifying and conditioning circuit 28 being coupled across circuit nodes 16 and 17, an output voltage $V_0$ is still generated which is proportional to $I_L$.

Figure 6:
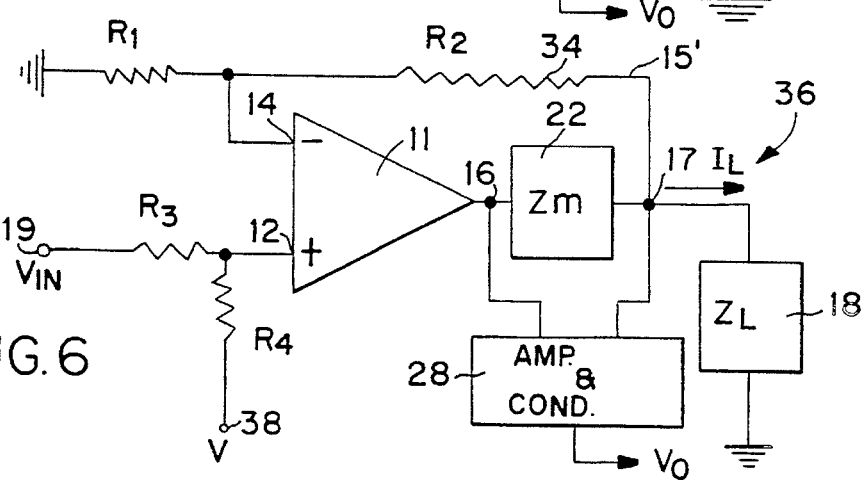
FIG. 6 is an electrical schematic diagram of a current-measuring amplifier in accordance with the subject invention.

Referring now to FIG. 6, shown thereat is a current-measuring non-inverting amplifier configuration 36. As shown, the input signal $V_{in}$ is again applied to the non-inverting (+) input port 12, as before, but now it is applied via a voltage divider consisting of resistive impedances $R_3$ and $R_4$. $R_3$ is connected to input signal terminal 19, while $R_4$ is connected to terminal 38, to which is applied a bias voltage V from a source, not shown. With respect to the inverting (−) input port 14, the feedback loop 15' includes a voltage divider comprising resistive impedances $R_1$ and $R_2$; however, resistive impedance $R_1$ is now returned to ground. For proper operation, $R_2 > R_1$ and $R_4 > R_3$. As before, the voltage across the current-measuring resistive impedance $(Z_m)$ 22 is coupled to an amplifying and conditioning circuit 28 which provides an output voltage $V_0$ which is proportional to $I_1$.

In the configuration of FIG. 6, the current-measuring feature does not change the amplification of the circuit, but limits the current $I_L$ op-amp 11 can produce because the voltage in front of the current-measuring impedance $Z_m$ will increase with device output current and can in certain instances, cause cut off of the device.

Figure 7:
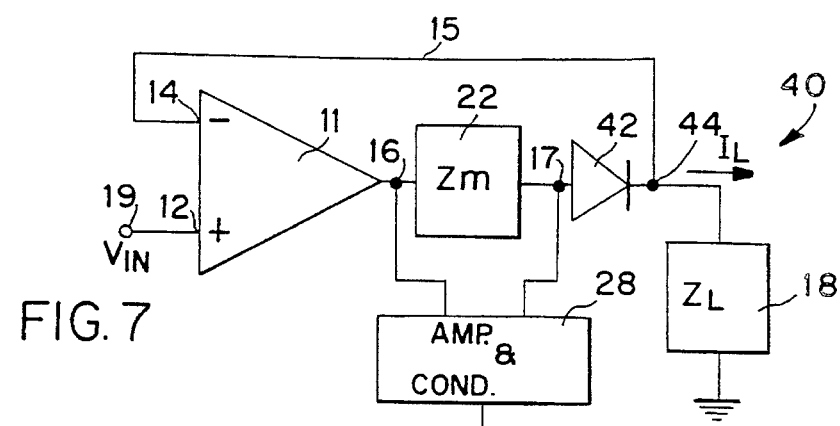
FIG. 7 is an electrical schematic diagram illustrative of a current-measuring precision diode circuit in accordance with the subject invention.

Another current-measuring circuit derived from the current-measuring voltage follower concept comprises a current-measuring precision diode circuit configuration 40 which is shown in FIG. 7. This embodiment comprises a circuit substantially identical to that shown in FIG. 2, with the exception that a precision diode 42 is connected in series between the current-measuring impedance 22 and the load impedance 18. Also, the feedback loop 15 comprising a direct connection now is taken from circuit node 44 which is on the output side of the diode 42 rather than circuit node 17.

Figure 8:
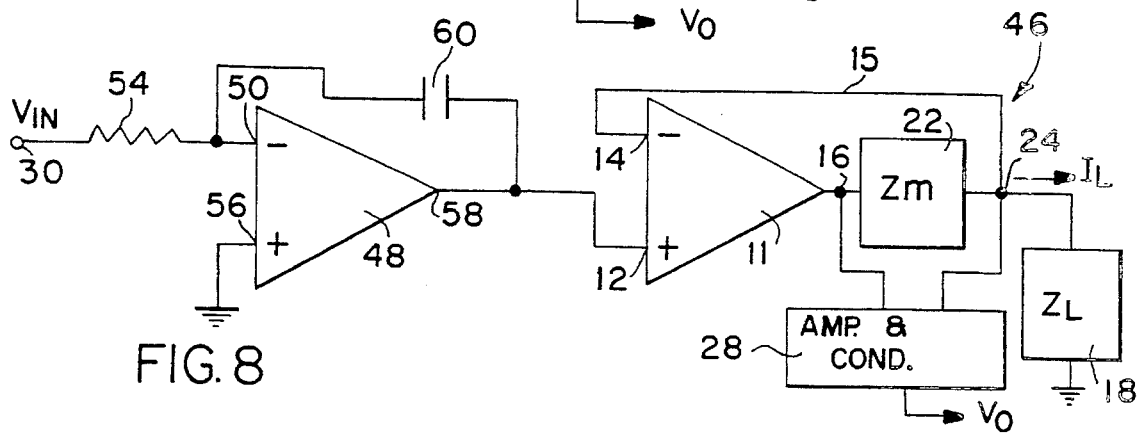
FIG. 8 is an electrical schematic diagram illustrative of an inverting type of current-measuring integrator in accordance with the subject invention.

Yet another circuit configuration 46 is shown in FIG. 8 and differs from the previous circuit configurations shown in FIGS. 2 through 7 in that the current-measuring voltage follower circuit shown in FIG. 2 is now coupled to the output of a conventional inverting integrator circuit including a second operational amplifier 48. As shown in FIG. 8, an input signal is coupled to the inverting (−) input port 50 of the op-amp 48 by way of an input terminal 30 and a resistive impedance 54. The non-inverting (+) input port 56 of the op-amp 48 is connected directly to ground. The output port 58 of the operational amplifier 48 is coupled back to the (−) input port 50 by means of a capacitive impedance shown by reference numeral 60.

In such a circuit, adding a measurement impedance $Z_m$ to the feedback loop of the operational amplifier 48 would drastically alter its performance; however, adding a current-measuring voltage follower (FIG. 2) to the output will not affect performance.

The circuits of FIGS. 2–6 are superior to their non current-measuring counterparts in circumstances where the current output must be known.

Figure 9:
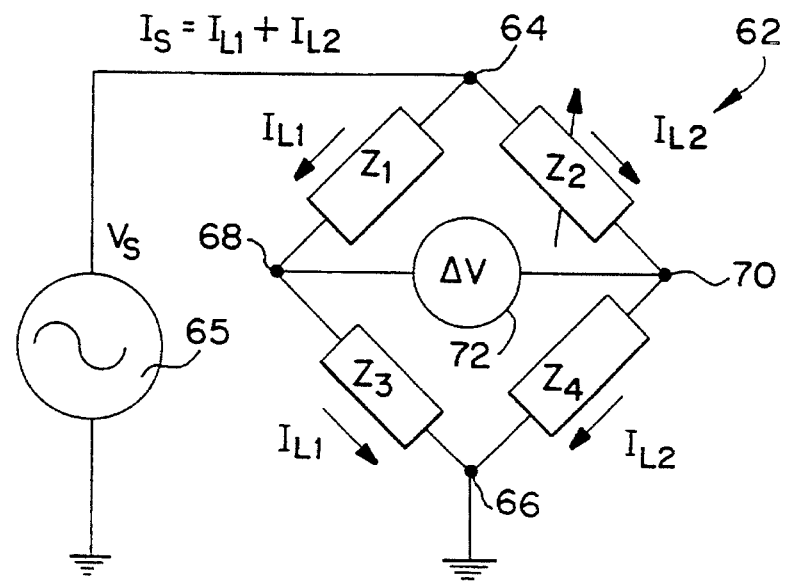
FIG. 9 is an electrical schematic diagram illustrative of a conventional Wheatstone bridge circuit.

Referring now to FIG. 9, shown thereat is a conventional four arm Wheatstone bridge 62 comprised of four impedances $Z_1$, $Z_2$, $Z_3$ and $Z_4$, with $Z_2$ being an adjustable impedance. The impedances $Z_1$ and $Z_2$ form adjacent arms of the bridge and terminate in a common circuit node 64 and which is coupled to one side of an AC voltage source 65 which generates a voltage $V_s$. The other two impedances $Z_3$ and $Z_4$ form a second pair of adjacent arms opposite the impedances $Z_1$ and $Z_2$ and terminate in a common circuit node 66 which is returned to ground as is the opposite side of the voltage source 64.

As is well known, if the impedances $Z_3$ and $Z_4$ are equal valued, the currents $I_{L1}$ and $I_{L2}$ will be equal when $Z_1=Z_2$ and the voltage difference between circuit nodes 68 and 70 will be equal to zero.. This and any bridge unbalance can be detected when a voltage measuring device 72 is coupled between circuit nodes 68 and 70.

If the impedance $Z_4$ comprises a sensor element, the voltage difference between circuit nodes 68 and 70 changes and the voltage measuring device 72 between these two points reflects such a change. However, if the impedances $Z_3$ and $Z_4$ are comprised of two sensor elements or a sensor element and a reference element, the difference in potential between circuit nodes 68 and 70 indicates leakage or crosstalk. This can be a significant problem which increases as bridge imbalance increases, for example at relatively high sensor readings.

Figure 10:
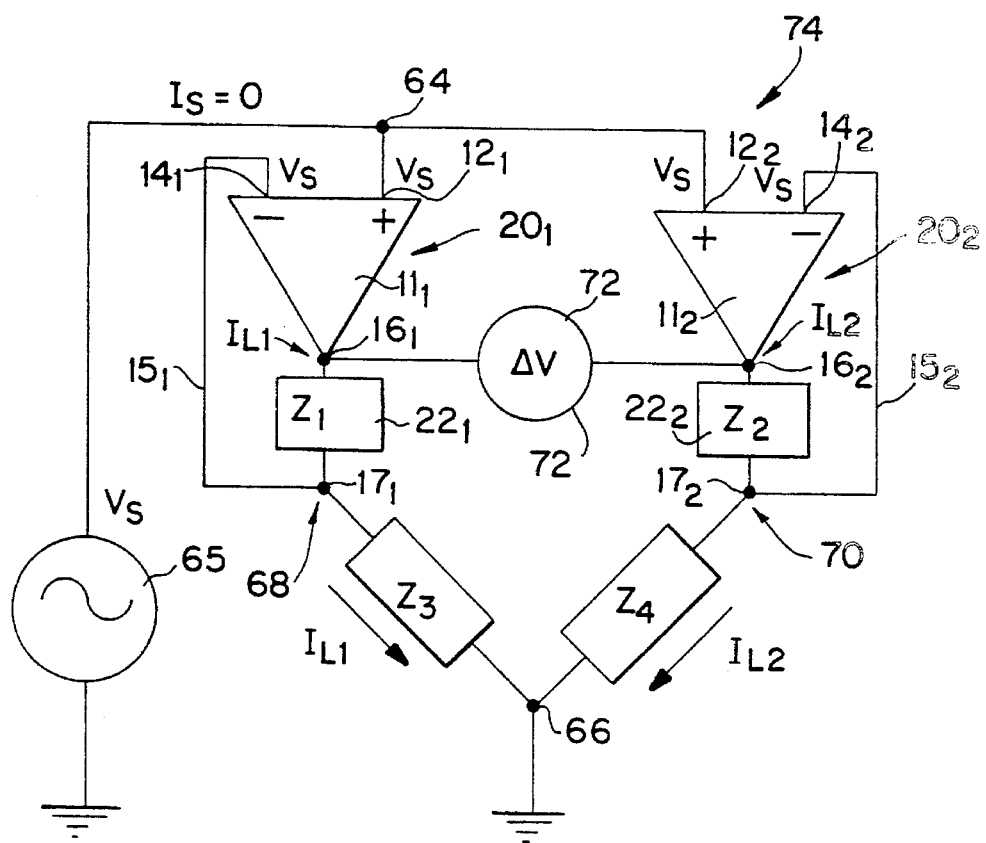
FIG. 10 is an electrical schematic diagram of a bridge circuit configured in accordance with the subject invention.

This now leads to the configuration shown in FIG. 10 wherein an active current bridge 74 is configured from a pair of current-metering voltage follower circuits $20'_1$ and $20'_2$ which form the upper left and right legs of the bridge and being connected at the common circuit node 64, while the left and right lower leg portions comprise the impedances $Z_3$ and $Z_4$ of FIG. 9 which are connected at the common circuit node 66.

Impedances $Z_1$ and $Z_2$ which are shown comprising legs of the conventional bridge circuit 62, shown in FIG. 9, are now included in the voltage follower circuits $20'_1$ and $20'_2$, including respective op-amps $11_1$ and $11_2$ having their respective non-inverting (+) input ports $12_1$ and $12_2$ commonly connected to circuit node 64. Direct connection feedback loops $15_1$ and $15_2$ couple back from circuit nodes $17_1$ and $17_2$ to the respective inverting(−) input ports $14_1$ and $14_2$. The circuit nodes $17_1$ and $17_2$ correspond to the bridge circuit nodes 68 and 70 shown in FIG. 9.

The left leg current $I_{L1}$ is generated by the current-measuring voltage follower $20'_1$ while the right leg current $I_{L2}$ is generated by the current-measuring voltage follower $20'_2$. The left leg current $I_{L1}$ passes through the impedance $Z_1$ which corresponds to the current-measuring impedance $Z_m$ of the current-measuring voltage follower shown in FIG. 2. From circuit node 68 the current $I_{L1}$ travels through impedance $Z_3$ to ground. In a like manner, the right leg current $I_{L2}$ travels through the impedance $Z_2$ to circuit node 70 and through impedance $Z_4$ to ground.

In the circuit configuration of FIG. 10, the voltages at circuit nodes 68 and 70 are identical and equal to the source voltage $V_s$. Assuming that the impedance $Z_4$ comprises an unknown impedance, the right leg current $I_{L2}$ is adjusted by the right leg op-amp $11_2$ as $Z_4$ changes to maintain the voltage drop across $Z_4$ locked to $V_s$. However, this changes the voltage across the impedance $Z_2$ and accordingly a voltage differential occurs between output ports $16_1$ and $16_2$ due to the respective voltage drop across $Z_2$ and $Z_1$. Accordingly, bridge measurement is now made across $16_1$ and $16_2$. Thus, the differential voltage measurement is made in front of the impedance $Z_1$ and $Z_2$ in the active current bridge of FIG. 10 rather than behind the impedances $Z_1$ and $Z_2$ of the classical Wheatstone bridge arrangement shown in FIG. 9.

In the active current bridge circuit 74 shown in FIG. 10, the current $I_s$ drawn from the voltage source 65 is approximately zero, whereas in the conventional Wheatstone bridge circuit 62 shown in FIG. 9, the current $I_s$ is equal to the sum of the currents $I_{L1}$ and $I_{L2}$.

Thus what has been shown and described is a new family of operational amplifier circuitry which is particularly able to keep instrumentation sensors locked at the same voltage potentials so that they do not exhibit cross-talk between them and yet are able to precisely measure the current that passes through each one of them individually as they function as sensors. Also, these circuits can be used to create simple, stand alone precision current meters for relatively small currents. Furthermore, the active current bridge shown and described can perform many functions that classical Wheatstone bridges are incapable of performing.

Having thus shown and described what is at present considered to be the preferred embodiments of the invention, it should be noted that the same has been made by way of illustration and not limitation. Accordingly, all modifications, alterations and changes coming within the spirit and scope of the invention are as set forth in the appended claims.

I claim:

1. An electrical circuit coupleable to a load impedance and adapted to measure current comprising:

an amplifier circuit having an output port and at least two input ports;

means for coupling an input signal to one of said input ports;

a current-measuring impedance coupled between said output port and said load impedance;

feedback circuit means coupled from a circuit node between said current-measuring impedance and said load impedance to the other of said two input ports; and current-measuring means coupled across said current-measuring impedance and being responsive to a voltage across said current-measuring impedance for generating an output voltage proportional to said current through said current-measuring impedance.

2. The electrical circuit according to claim 1 wherein said means coupled across the current-measuring impedance includes amplifier means.

3. The electrical circuit according to claim 1 wherein said means coupled across the current-measuring impedance includes signal conditioning means.

4. The electrical circuit according to claim 1 wherein said amplifier circuit comprises an operational amplifier and wherein said at least two input ports comprise relatively high impedance ports and said output port comprises a relatively low impedance port.

5. The electrical circuit according to claim 1 wherein said amplifier circuit comprises an operational amplifier, said at least two input ports include a non inverting (+) input port and an inverting (−) input port, and wherein said input signal is coupled to the (+) input port and said feedback circuit means is coupled from said circuit node to the (−) input port.

6. The electrical circuit according to claim 5 wherein said feedback circuit means comprises a direct connection between said circuit node and the (−) input port.

7. An electrical circuit coupleable to a load impedance and adapted to measure current comprising:

an operational amplifier with an output port and at least two input ports including a noninverting input port and an inverting input port;

means for coupling an input signal to said noninverting input port;

a current-measuring impedance coupled between said output port and said load impedance; and feedback circuit means coupled from a circuit node between said current-measuring impedance and said load impedance to said inverting input port, said feedback circuit means further including a first voltage divider network and additionally including a second voltage divider network coupling said input signal to said noninverting input port, whereby a voltage generated across said current-measuring impedance is proportional to said current through said current-measuring impedance.

8. The electrical circuit according to claim 7 wherein said first voltage divider network includes first impedance means coupling the (−) input port to a reference potential and second impedance means coupling said circuit node back to ground potential.

9. The electrical circuit according to claim 8 wherein the impedance value of the second impedance means is greater than the impedance value of the first impedance means.

10. The electrical circuit according to claim 9 wherein said first and second impedance means include first and second resistive impedances.

11. The electrical circuit according to claim 8 wherein said second voltage divider network comprises third impedance means coupling the input signal to the (+) input port and fourth impedance means coupling the (+) input port to a bias potential.

12. The electrical circuit according to claim 11 wherein said third and forth impedance means includes third and fourth resistive impedances.

13. The electrical circuit according to claim 1 wherein said amplifier circuit comprises an operational amplifier, said at least two input ports include a non inverting (+) input port and an inverting (−) input port, and wherein said (+) port is coupled to a reference potential and said current input signal and said feedback circuit means are coupled to the (−) input port.

14. The electrical circuit according to claim 13 and additionally including first impedance means coupling said input signal to the (−) input port and wherein said feedback circuit means coupled to the (−) input port includes second impedance means.

15. The electrical circuit according to claim 14 said first and second impedance means include first and second resistive impedances.

16. The electrical circuit according to claim 15 wherein the magnitude of said first and second resistive impedances are substantially equal.

17. The electrical circuit according to claim 15 wherein the magnitude of said second resistive impedance is greater than the magnitude of said first resistive impedance.

18. An electrical circuit coupleable to a load impedance and adapted to measure current comprising:

an operational amplifier having an output port and at least two input ports including a noninverting input port and an inverting input port;

means for coupling an input signal to said noninverting input port;

a current measuring impedance coupled between said output port and a diode, said diode being coupled between said current measuring impedance and said load impedance; and feedback circuit means coupled from a circuit node between said diode and said load impedance to said inverting input port, whereby a voltage generated across said current-measuring impedance is proportional to said current through said current-measuring impedance.

19. The electrical circuit according to claim 18 wherein said feedback circuit means comprises a direct connection between said circuit node and the (−) input port.

20. An electrical circuit coupleable to a load impedance and adapted to measure current comprising:

an operational amplifier having an output port and at least two input ports including a noninverting input port and an inverting input port;

integrator circuit means coupleable between an input signal and said noninverting input port of said operational amplifier;

a current-measuring impedance coupled between said output port and said load impedance; and a feedback circuit including a direct connection coupled from a circuit node between said current-measuring impedance and said load impedance to said inverting input port of said operational amplifier, whereby a voltage generated across said current-measuring impedance is proportional to said current through said current-measuring impedance.

21. The circuit according to claim 20 wherein said integrator circuit means includes a second operational amplifier having at least two input ports and an output port, one of said two input ports being coupled to said input signal and the other of said two input ports being coupled to a reference potential, and capacitive feedback means coupled between the output and said one input port.

22. The circuit according to claim 21 and additionally including impedance means coupling said input signal to said one input port.

23. The circuit according to claim 22 wherein said impedance means comprises resistive impedance means.

24. An electrical bridge measuring circuit, comprising:

a first and a second leg of a bridge circuit commonly coupled to a first circuit node;

a third and fourth leg of the bridge circuit commonly coupled to a second circuit node;

said first and third leg commonly coupled to a third circuit node and said second and fourth leg commonly coupled to a fourth circuit node;

a voltage source coupled across said first and second circuit nodes;

wherein said third and fourth legs of the bridge circuit respectively comprise impedance means; and wherein said first and second legs of the bridge circuit comprise respective amplifier circuits, each including an amplifier having an output port and at least two input ports, and wherein one input port of said two input ports of both said amplifiers are commonly connected to said first circuit node, impedance means coupled from said output port to said third and fourth circuit nodes, respectively, and respective feedback circuit means coupled from said third and fourth circuit node to the other input port of said two input ports of said amplifiers; and means coupled between the respective output ports of said amplifiers for detecting a voltage difference therebetween.

25. The bridge measuring circuit according to claim 24 wherein each said amplifier comprises an operational amplifier, said at least two input ports include a non inverting (+) input port and an inverting (−) input port and wherein said first circuit node is commonly coupled to the (+) input ports and said feedback means are coupled to the (−) input ports.

26. The bridge measuring circuit according to claim 25 wherein said feedback means comprise a direct circuit connection between the respective (−) input ports of said operational amplifiers and said third and fourth circuit nodes.

27. The bridge measuring circuit according to claim 25 wherein said impedance means coupled from said output ports of said amplifiers comprise resistive impedance means.

28. The circuit according to claim 7 wherein a current-measuring means is coupled across said current-measuring impedance, said current-measuring means being responsive to said voltage across said current-measuring impedance and generating an output voltage proportional to said current through said current-measuring impedance.

29. The circuit according to claim 18 wherein a current-measuring means is coupled across said current-measuring impedance, said current-measuring means being responsive to said voltage across said current-measuring impedance and generating an output voltage proportional to said current through said current-measuring impedance.

30. The circuit according to claim 20 wherein a current-measuring means is coupled across said current-measuring impedance, said current-measuring means being responsive to said voltage across said current-measuring impedance and generating an output voltage proportional to said current through said current-measuring impedance.

* * * * *